United States Patent
Moniwa et al.

(10) Patent No.: US 7,902,539 B2
(45) Date of Patent: Mar. 8, 2011

(54) SEMICONDUCTOR DEVICE AND METHOD OF MANUFACTURING THE SAME

(75) Inventors: Masahiro Moniwa, Tokyo (JP); Fumihiko Nitta, Tokyo (JP); Masamichi Matsuoka, Tokyo (JP); Satoshi Iida, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/274,740

(22) Filed: Nov. 20, 2008

(65) Prior Publication Data

US 2009/0140234 A1   Jun. 4, 2009

(30) Foreign Application Priority Data

Nov. 29, 2007   (JP) ................ 2007-309124

(51) Int. Cl.
*H01L 47/00* (2006.01)

(52) U.S. Cl. .............. 257/4; 257/2; 257/3; 438/95

(58) Field of Classification Search ............ 257/2–5, 257/E21.476; 438/95
See application file for complete search history.

(56) References Cited

U.S. PATENT DOCUMENTS 7,071,485 B2 * 7/2006 Takaura et al. ............ 257/3

FOREIGN PATENT DOCUMENTS

| JP | 2006-287222 | 10/2006 |
| JP | 2006-294970 | 10/2006 |
| JP | 2006-352082 | 12/2006 |

OTHER PUBLICATIONS

Y.N. Hwang et al., "Writing Current Reduction for High-density Phase-change RAM," International Electron Devices Meeting (2003), pp. 893-896.

* cited by examiner

*Primary Examiner* — Theresa T Doan
(74) *Attorney, Agent, or Firm* — McDermott Will & Emery LLP

(57) ABSTRACT

Any of a plurality of contact plugs which reaches a diffusion layer serving as a drain layer of an MOS transistor has an end provided in contact with a lower surface of a thin insulating film provided selectively on an interlayer insulating film. A phase change film constituted by GST to be a chalcogenide compound based phase change material is provided on the thin insulating film, and an upper electrode is provided thereon. Any of the plurality of contact plugs which reaches the diffusion layer serving as a source layer has an end connected directly to an end of a contact plug penetrating an interlayer insulating film.

9 Claims, 13 Drawing Sheets

PRIOR ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more particularly to a phase change memory for nonvolatily storing information with a change in a resistance value which is caused by a phase change.

2. Description of the Background Art

A phase change memory carries a current (an amorphous current) for causing an amorphousness over a memory cell constituted by a phase change material to melt the phase change material through resistance heating, then performs cooling to bring an amorphous state, and carries a current (a crystallizing current) for causing a crystallization over the phase change material to anneal the phase change material through the resistance heating, thereby bringing a crystalline state.

Binary information can be selectively written to a memory cell in two states of the phase change material. A state which is once subject to a phase change is not changed at an ordinary temperature. Therefore, it is possible to hold the information nonvolatily.

The phase change memory is a nonvolatile memory which can also be applied to both a memory embedded logic chip and a memory stand-alone chip and has been developed in a strategic location as a memory which succeeds to an existing NOR type flash memory and MONOS (Metal Oxide Nitride Oxide Semiconductor) memory. The MONOS is also referred to as SONOS (Silicon Oxide Nitride Oxide Semiconductor).

The research and development of the phase change memory for carrying out storage and read by conducting the phase change material has already been started in approximately 1970. A decline was caused for a certain period of time. However, a novel developed phase change material (GeSbTe) was successfully applied to an optical disk so that an activity was taken again. As a trigger for recovering an opportunity, a 4 Mbit phase change memory was published by Intel Co., Ltd. in 2002. After that, a large number of semiconductor manufacturers entered the development.

There have been invented a cross point type having no access device to an element, a type using a diode as an access device, a type using an MOSFET (Metal-Oxide-Semiconductor Field-Effect-Transistor) as an access device or a type using a bipolar transistor in a case in which a phase change element is arranged as a memory array.

An example of a phase change memory using the MOSFET as an access device has been described in Y. N. Hwang et. al., "Writing Current Reduction for High-density Phase-change RAM" International Electron Devices Meeting 2003, pp. 893-896 (non-patent document 1).

For a phase change film, a chalcogenide semiconductor film such as GeSbTe (GST) is usually used. An ordinary semiconductor material and process can be applied to the MOSFET serving as the access device and a process for forming and processing, a device isolating film, a wiring layer and an interlayer insulating film.

By taking, as an example, a non-patent document 1, description will be given to the related art.

First of all, FIG. 20 shows a sectional structure of a non-patent document 1.

As shown in FIG. 20, an MOS transistor Q1 for access is provided on a silicon substrate 1 and an interlayer insulating film IL1 is provided to cover the MOS transistor Q1. A plurality of contact plugs CP1 to penetrate the interlayer insulating film IL1 is provided to reach a plurality of diffusion layers 3 disposed in a surface of the silicon substrate 1. A silicide layer SS is provided on the diffusion layer 3 and each contact plug CP1 is actually provided in contact with the silicide layer SS. For convenience, however, an expression of "reach the diffusion layer 3" is used.

The MOS transistor Q1 includes a gate insulating film 4 provided selectively on an active region defined by an isolation insulating film 2, a gate electrode 5 provided on the gate insulating film 4, and the diffusion layer 3 which is provided selectively in the surface of the silicon substrate 1 on the outside of both side surfaces in a direction of a gate length of the gate electrode 5 and serves as a source-drain layer. The gate electrode 5 is extended in a depth direction with respect to the drawing and serves as a word line and is covered with the silicide layer SS. The side surfaces of the gate insulating film 4 and the gate electrode 5 are covered with a sidewall insulating film, which is not shown.

Any of the plurality of contact plugs CP1 which reaches the diffusion layer 3 to be a source layer of the MOS transistor Q1 has an end connected to a source line SL (extended in the depth direction with respect to the drawing) having an end provided on the interlayer insulating film IL1, and the other contact plugs CP1 are connected to a connecting pad PD having an end disposed on the interlayer insulating film IL1. The source line SL and the connecting pad PD are constituted by a first metal wiring (M1).

The source line SL and the connecting pad PD are provided in an interlayer insulating film IL2 disposed on the interlayer insulating film IL1, and an interlayer insulating film IL3 is provided on the interlayer insulating film IL2. A contact plug CP0 is provided to reach the connecting pad PD penetrating the interlayer insulating film IL3, and an end of the contact plug CP0 is directly connected to a lower main surface of a phase change film 20 provided on the interlayer insulating film IL3.

The phase change film 20 is constituted by GST to be a chalcogenide compound based phase change material, an upper electrode 21 is provided on the phase change film 20, and the phase change film 20 and the upper electrode 21 will be referred to as a phase change element PE together.

An interlayer insulating film IL4 is provided on the interlayer insulating film IL3 to cover the phase change film 20 and the upper electrode 21, and a contact plug CP2 is disposed to reach the upper electrode 21 through the interlayer insulating film IL4. The contact plug CP2 has an end connected to a bit line BL provided on the interlayer insulating film IL4. The bit line BL is constituted by a second metal wiring.

With the structure described above, a region surrounded in a broken line in the drawing, that is, a region including a single MOS transistor Q1 and a phase change element PE conducted by turning ON the MOS transistor Q1 constitutes a memory cell MC corresponding to one bit. Two memory cells MCs which are close to each other are constituted to share a single source line and the contact plug CP0 linked thereto.

In a case in which the structure of the memory cell MC shown in FIG. 20 is employed, a distance corresponding to two interlayer insulating films is formed between a first metal wiring (M1) formed in the interlayer insulating film IL2 and a second metal wiring (M2) formed on the interlayer insulating film IL4 in a peripheral circuit region. The reason is that the structure is set to be common to the structure of a memory cell region, resulting in a simplification of a manufacturing process.

More specifically, in the memory cell MC, it is necessary to laminate the interlayer insulating films IL3 and IL4 in order to form a three-stage connecting structure including the contact plug CP0, the phase change element PE and the contact plug CP2 between the connecting pad PD and the second metal wiring M2. Therefore, the peripheral circuit region is also adapted thereto.

As a result, in the peripheral circuit region, a depth of the contact plug (CP2) is increased and a thickness of the interlayer insulating film between the first metal wiring (M1) and the second metal wiring (M2) is increased so that a line capacity is decreased. In particular, this is a serious problem in a embedded chip. More detailed description will be given.

In a memory embedded logic chip (an embedded chip) in which a phase change memory and a logic circuit are provided, a design of the logic circuit (peripheral circuit) is changed corresponding to the structure of a memory cell in order to simplify the manufacturing process. The circuit is usually designed through a computer simulation using a model set obtained by mathematically modeling an MOS transistor characteristic, a wiring resistance and a parasitic capacity. As described above, in the case in which the line capacity is different from that in an existing model set as a result of the adaptation to the structure of the memory cell, it is necessary to modify the model set and to design the circuit again. In a embedded chip in which various products are assumed to be applying destinations, particularly, a cost is increased in respect of a business profit, which is a serious problem.

The problem is caused by disposing the phase change element between the wiring layers. In order to solve the problem, it can be proposed to dispose the phase change element below a lowermost layer wiring.

As an example of the structure in which the phase change element is disposed below the lowermost layer wiring, the structures disclosed in Japanese Patent Application Laid-Open No. 2006-287222 (patent document 1) and 2006-294970 (patent document 2) are taken.

In patent document 1 and patent document 2, a decrease in the line capacity is not recognized as a problem to be solved. However, FIG. 1 in patent document 1 and FIG. 13 in patent document 2 have disclosed a structure in which the phase change element is provided below the lowermost layer wiring. It can be supposed that a drawback of the decrease in the line capacity is not caused by the employment of the structure.

In a case in which the phase change element is provided below the lowermost layer wiring, the phase change element has such a structure that the lowermost layer wiring is interposed between the lower interlayer insulating film and the upper interlayer insulating film which are obtained by dividing the lowermost layer wiring into two upper and lower layers. The lowermost layer wiring is formed on the upper interlayer insulating film and is connected to the upper surface of the phase change element through the contact plug formed in the upper insulating film. Moreover, the lower surface of the phase change element is connected to the diffusion layer formed in the silicon substrate through the contact plug formed in the lower insulating film.

On the other hand, in the peripheral circuit region, the lowermost layer wiring is connected to the diffusion layer formed in the silicon substrate through the contact plug penetrating the lower interlayer insulating film and the upper interlayer insulating film.

However, the employment of the structure causes some new problems which will be described below.

More specifically, as a first problem, the contact plug for connecting the lowermost layer wiring to the semiconductor substrate is excessively deep as discussed in patent document 2. In this case, there are required a process technique and a process device which correspond to a high aspect ratio. A cost is increased and thereby the business profit is damaged.

In FIG. 12 showing patent document 2, there is disclosed a structure in which the lowermost layer wiring and the phase change element are formed in the "same layer", that is, on the same level. Instead, a degree of difficulty of the process is raised and the number of process steps is increased.

As a second problem, the contact plug (the lower plug) for connecting the lower surface of the phase change element to the semiconductor substrate is deepened and it is hard to reduce a diameter. More specifically, there is generally employed a method of setting the diameter of the lower plug such as the contact plug CP0 in FIG. 20 to be smaller than a standard hole diameter of the contact plug (a diameter of approximately several tens nm), thereby increasing a current density in order to reduce an operating current in the phase change memory. For this purpose, it is desirable that the depth of the plug should be small in respect of the characteristic of dry etching.

In the memory cell MC shown in FIG. 20, the depth of the contact plug CP0 is determined by only the thickness of the interlayer insulating film IL2 for insulating the phase change element PE from the first metal wiring provided thereunder. By setting a process for forming the interlayer insulating film IL2 and the CMP process as a special process to strictly increase precision, therefore, it is possible to form the interlayer insulating film IL2 thinly, thereby reducing the depth of the contact plug CP0 to some degree.

In a case in which the phase change element is disposed below the first metal wiring, however, the interlayer insulating film provided thereunder is to be thicker than at least the height of the gate electrode (word line) in order to cover the MOS transistor. The depth of the contact plug is greater than that of the contact plug CP0 shown in FIG. 20.

As described above, in the conventional memory embedded logic chip in which the phase change memory and the logic circuit are provided, there is a request for disposing the phase change element below the lowermost layer wiring in order to prevent the thickness of the interlayer insulating film between the first metal wiring and the second metal wiring from being increased, resulting in a decrease in the line capacity. In that case, however, the contact plug for connecting the lowermost layer wiring to the semiconductor substrate is excessively deepened so that there are required a process technique and a process device which correspond to a high aspect ratio, resulting in an increase in a cost. Moreover, there is a problem in that the depth of the contact plug for connecting the lower surface of the phase change element to the semiconductor substrate cannot be set to be smaller than the height of the gate electrode (the word line) and it is hard to reduce the diameter of the contact plug, resulting in an increase in an operating current.

SUMMARY OF THE INVENTION

It is an object of the present invention to provide a structure in which a cost is not increased and an increase in an operating current is also prevented also in a structure in which a phase change element is provided below a lowermost layer wiring in a memory embedded logic chip in which a phase change memory and a logic circuit are provided.

An aspect of the present invention is directed to a semiconductor device in which any of a plurality of first layer contact plugs which reaches a diffusion layer serving as a drain layer of an MOS transistor is provided in contact with a lower surface of a thin insulating film having an end disposed selectively on a first interlayer insulating film. A phase change film constituted by GST to be a chalcogenide compound based phase change material is provided on the thin insulating film and an upper electrode is provided thereon to constitute a phase change element. Moreover, any of the plurality of first layer contact plugs which reaches a diffusion layer serving as a source layer has an end connected directly to an end of a second layer contact plug penetrating the second interlayer insulating film, and the other end of the contact plug is connected to a source line provided on a second interlayer insulating film.

According to the semiconductor device, a memory cell structure of an RUML (Resistor Under Metal-Line) type is employed so that a decrease in a line capacity caused by the thickness increase of an interlayer insulating film between a first metal wiring and a second metal wiring is prevented. Moreover, the source line and the diffusion layer are connected through a stacked plug constituted by the first layer contact plug and the second layer contact plug. Also in a case in which a distance between the first metal wiring and a silicon substrate is increased, therefore, an aspect ratio of an individual plug is not increased. Therefore, there are not required a process technique and a process device which correspond to a high aspect ratio, and an increase in a cost can also be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment

<A. Structure of Device>

Figure 1:
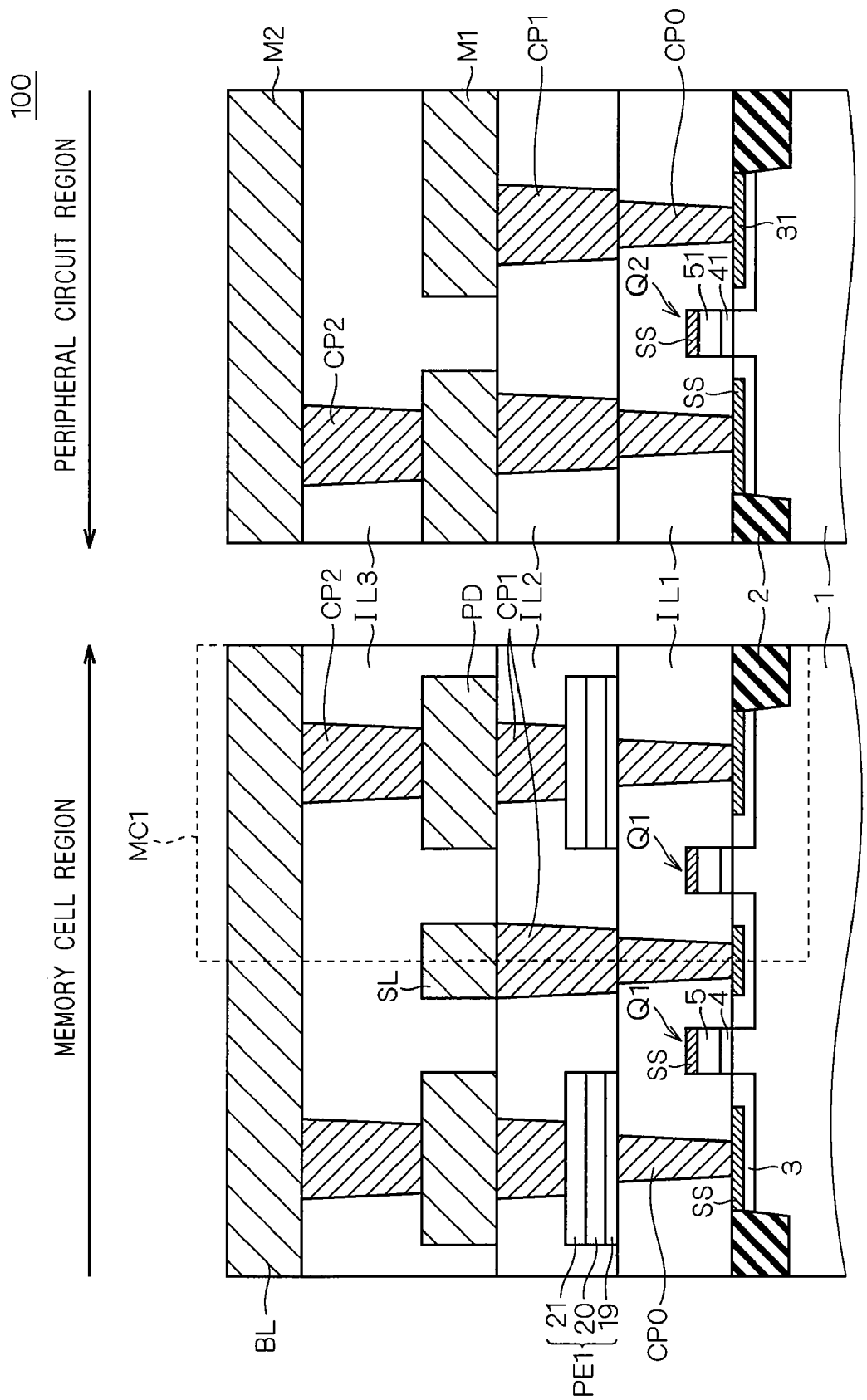
FIG. 1 is a sectional view showing a structure of a semiconductor device according to an embodiment of the present invention.

A structure of a semiconductor device 100 according to an embodiment of the present invention will be described with reference to FIG. 1. In FIG. 1, a memory cell region and a peripheral circuit region are shown side by side.

As shown in FIG. 1, an MOS transistor Q1 for access is provided on a silicon substrate 1 in a memory cell region and an interlayer insulating film IL1 is provided to cover the MOS transistor Q1.

A plurality of contact plugs CP0 (first layer contact plugs) penetrating the interlayer insulating film IL1 is provided to reach a plurality of diffusion layers 3 serving as source or drain layers of the MOS transistor Q1.

A silicide layer SS is provided on the diffusion layer 3 and each of the contact plugs CP0 actually reaches the silicide layer SS. For convenience, an expression of "reach the diffusion layer 3" is used.

The MOS transistor Q1 includes a gate insulating film 4 provided selectively on an active region defined by an isolation insulating film 2, a gate electrode 5 provided on the gate insulating film 4, and the diffusion layer 3 which is provided selectively in the surface of the silicon substrate 1 on the outside of both side surfaces in a direction of a gate length of the gate electrode 5 and serves as a source or drain layer. The gate electrode 5 is extended in a depth direction with respect to the drawing and serves as a word line and is covered with the silicide layer SS. The side surfaces of the gate insulating film 4 and the gate electrode 5 are covered with a sidewall insulating film, which is not shown.

A term of "MOS" has been used for a metal/oxide/semiconductor laminating structure since long ago and it is assumed that capital letters of Metal-Oxide-Semiconductor are taken. In a field effect transistor having the MOS structure, however, materials of a gate insulating film and a gate electrode are particularly improved in respect of an integration and an enhancement in a manufacturing process in recent years, and polycrystalline silicon is employed in place of a metal for the material of the gate electrode. In respect of an improvement in an electrical characteristic, moreover, a material having a high dielectric constant is employed as the material of the gate insulating film. The material is not always restricted to an oxide. Therefore, the term of "MOS" is not employed with a restriction to only the "metal/oxide/semiconductor" laminating structure. Also in this specification, the restriction is not premised. More specifically, in consideration of a common sense of technology, the "MOS" is an aberration originated in a derivation of a word and widely has a meaning including a conductor/insulator/semiconductor laminating structure.

Any (a first plug) of the plurality of contact plugs CP0 which reaches the diffusion layer 3 serving as a drain layer of the MOS transistor Q1 has an end provided in contact with a lower surface of a thin insulating film 19 provided selectively on the interlayer insulating film IL1. A phase change film 20 constituted by GST to be a chalcogenide compound based phase change material is provided on the thin insulating film 19, and an upper electrode 21 is provided thereon. The thin insulating film 19, the phase change film 20 and the upper film 21 will be referred to as a phase change element PE1 together. An interlayer insulating film IL2 is provided on the interlayer insulating film IL1 to cover the phase change element PE1.

Moreover, any (a second plug) of the plurality of contact plugs CP0 which reaches the diffusion layer 3 to be a source layer has an end connected directly to any (a third plug) of the contact plugs CP1 (second contact plugs) penetrating the interlayer insulating film IL2 which reaches a source line SL (extended in the depth direction with respect to the drawing) provided on the interlayer insulating film IL2. Moreover, an end of the contact plug CP1 (a fourth plug) penetrating the interlayer insulating film IL2 is connected to a connecting pad PD provided on the interlayer insulating film IL2 to reach the upper electrode 21 of the phase change element PE1. The source line SL and the connecting pad PD are constituted by a first metal wiring.

The source line SL and the connecting pad PD are provided in an interlayer insulating film IL3 provided on the interlayer insulating film IL2. A contact plug CP2 (a third layer contact plug) is provided to reach the connecting pad PD through the interlayer insulating film IL3 and an end of the contact plug CP2 is connected to a bit line BL (a second metal wiring) provided on the interlayer insulating film IL3.

On the other hand, in a peripheral circuit region, an MOS transistor Q2 is provided on the silicon substrate 1 and the interlayer insulating film IL1 is provided to cover the MOS transistor Q2. The contact plug CP0 penetrating the interlayer insulating film IL1 is provided to reach a diffusion layer 31 to be a source or a drain layer of the MOS transistor Q2.

The MOS transistor Q2 includes a gate insulating film 41 provided selectively on an active region defined by the device isolating film 2, a gate electrode 51 provided on the gate insulating film 41, and the diffusion layer 31 which is provided selectively in the surface of the silicon substrate 1 on the outside of both side surfaces in a direction of a gate length of the gate electrode 51 and serves as a source or drain layer. The gate electrode 51 is covered with a silicide layer SS. The side surfaces of the gate insulating film 41 and the gate electrode 51 are covered with a sidewall insulating film, which is not shown.

The interlayer insulating film IL2 is provided on the interlay insulating film IL1 and the plurality of contact plugs CP0 have ends connected to one of the ends of the contact plug CP1 penetrating the interlayer insulating film IL2, and the other end of the contact plug CP1 is connected to the first metal wiring M1 provided on the interlayer insulating film IL2.

The first metal wiring M1 is provided in the interlayer insulating film IL3 disposed on the interlayer insulating film IL2. The contact plug CP2 is provided to reach the metal wiring M1 through the interlayer insulating film IL3 and the end of the contact plug CP2 is connected to the second metal wiring M2 provided on the interlayer insulating film IL3.

With the structure described above, a region surrounded in a broken line of FIG. 1, that is, a region including a single MOS transistor Q1 and a phase change element PE1 conducted by turning ON the MOS transistor Q1 constitutes a memory cell MC1 corresponding to one bit. Two memory cells MCs which are close to each other are constituted to share a single source line and a double plug (a stacked plug) having the contact plugs CP0 and CP1 linked thereto.

<B. Effect>

By employing the memory cell structure of an RUML (Resistor Under Metal-Line) type in which the phase change element PE1 is disposed below the first metal wiring M1 (the source line SL and the connecting pad PD), thus, it is possible to reduce the thickness of the interlayer insulating film between the first metal wiring and the second metal wiring. Accordingly, a line capacity can be prevented from being decreased. Moreover, the source line SL and the diffusion layer 3 are connected to each other through the double plug constituted by the contact plugs CP0 and CP1. Therefore, also in a case in which a distance between the first metal wiring M1 and the silicon substrate 1 is increased, an aspect ratio of the individual plug is not increased. Consequently, there are not required a process technique and a process device which correspond to a high aspect ratio, and an increase in a cost can also be suppressed.

Since the interlayer insulating film IL1 provided under the first metal wiring M1 covers the MOS transistor Q1, moreover, it is to be thickened more greatly than at least a height of the gate electrode 5 (a word line). In a case in which it is necessary to cause a current having a high current density to flow to the phase change element PE1 without increasing an operating current, however, a diameter of the contact plug CP0 is to be reduced so that there are generated a process technique and a process device which correspond to a high aspect ratio.

In the phase change element PE1, however, a main surface on an opposite side to a main surface of the phase change film 20 on which the upper electrode 21 is provided is covered with the thin insulating film 19. Therefore, the thin insulating film 19 serves as a thermal resistor and can suppress a flow, to the contact plug CP0, of heat generated in the GST in the vicinity of a connecting region to the contact plug CP0. Accordingly, a thermal efficiency can be enhanced considerably. Therefore, even if the contact plug CP0 has a large diameter and a low current density (an operating current is not increased), it is possible to cause a phase change over the phase change film 20.

In the semiconductor device 100, accordingly, the diameter of the contact plug CP0 for connecting the phase change element PE1 to the silicon substrate 1 can be set to be equal to that of the contact plug CP0 used for connecting the source line SL to the diffusion layer 3, and there are not required a process technique and a process device which correspond to a high aspect ratio.

The thin insulating film 19 functions as a resistor having a thickness of 0.5 nm to 5 nm and causing a transmission current (for example, a tunnel current or a Poole-Frenkel current) to dominantly flow with the thickness, and having a resistance value of approximately 30 kΩ for causing a current of approximately 100 µA to 1 mA to flow to the phase change film 20.

For a material of the thin insulating film 19, it is desirable to use a material having a high adhesion to chalcogenide and a lower heat conductivity than that of a contact plug (for example, tungsten), for example, a Ta (tantalum) oxide film. Japanese Patent Application Laid-Open No. 2006-352082 has disclosed a structure in which a thin insulating film is used for a phase change element.

As shown in FIG. 1, moreover, at least layer structures provided under the second metal wiring M2 can be set to be the same in the memory cell region and the peripheral circuit region. Therefore, it is possible to simplify a manufacturing process. It is not necessary to change a design of the logic circuit corresponding to the structure of the memory cell. In an embedded chip, therefore, it is possible to prevent the cost from being increased.

As described above, in the semiconductor device 100 in which the phase change memory and the logic circuit are provided on the common silicon substrate, the cost is not increased and the operating current can also be prevented from being increased also in the structure in which the phase change element is provided below the lowermost layer wiring.

Figure 2:
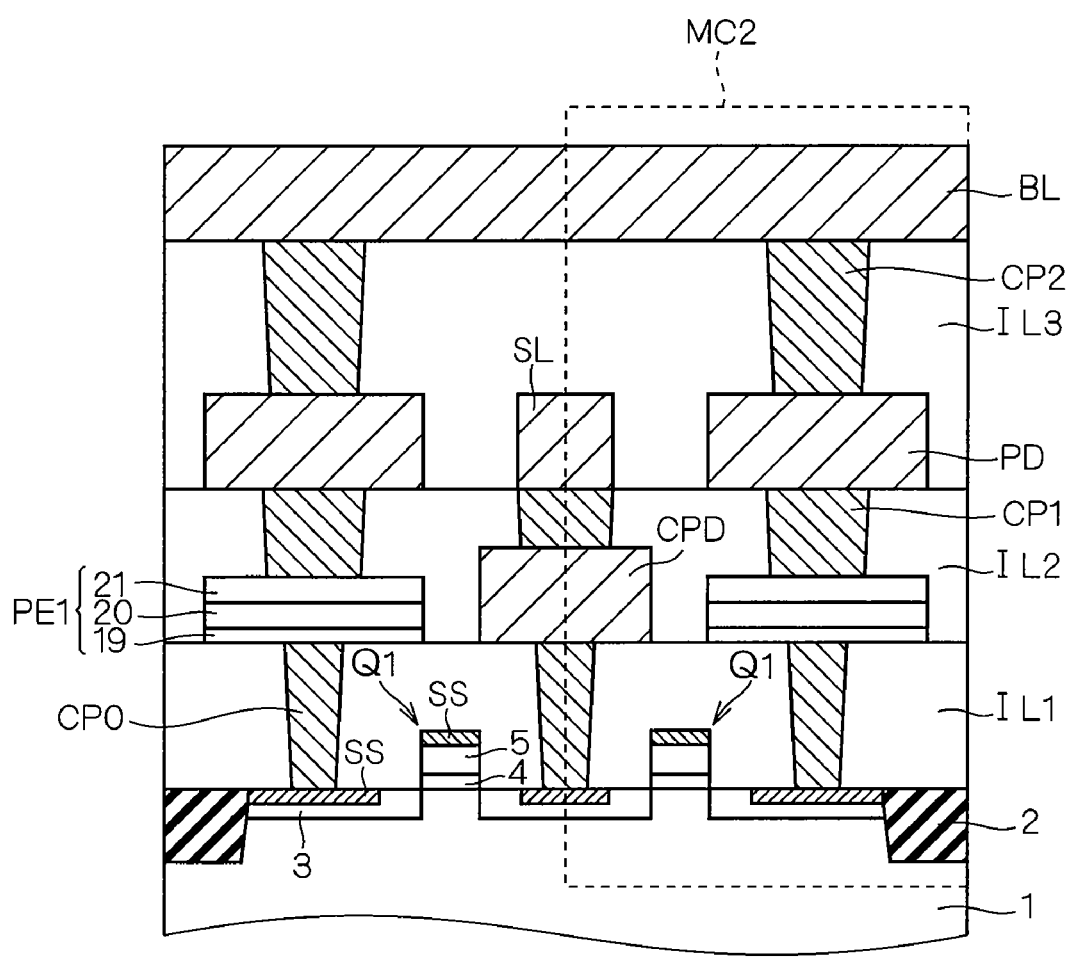
FIG. 2 is a sectional view showing a structure of a comparison target for explaining effects produced by the semiconductor device according to the embodiment of the present invention.

With reference to FIG. 2, next, description will be given to further effects obtained by connecting the source line SL to the diffusion layer 3 through the double plug constituted by the contact plugs CP0 and CP1.

FIG. 2 shows an example in which the source line SL and the diffusion layer 3 are connected with a structure in which a connecting pad CPD is provided between the contact plugs CP0 and CP1. In FIG. 2, the same structures as those in the semiconductor device 100 shown in FIG. 1 have the same reference numerals and repetitive description will not be given.

As shown in FIG. 2, the contact plug CP0 reaching the diffusion layer 3 serving as the source layer of the MOS transistor Q1 has an end connected to the lower surface of the connecting pad CPD provided on the interlayer insulating film IL1, and one of ends of the contact plug CP1 penetrating the interlayer insulating film IL2 is connected to the upper surface of the connecting pad CPD. The other end of the contact plug CP1 is connected to the source line SL provided on the interlayer insulating film IL2.

With the structure, a region surrounded in a broken line in FIG. 2, that is, a region including the single MOS transistor Q1 and the phase change element PE1 conducted by turning ON the MOS transistor Q1 constitutes a memory cell MC2 corresponding to one bit.

In an ordinary semiconductor technique, in a case in which an upper contact plug is connected to a lower contact plug, a connecting pad constituted by a metal wiring layer is provided therebetween. This is a measure for causing a positional shift of the upper and lower contact plugs to have a margin and suppressing a fluctuation in a contact resistance even if the positional shift is generated.

It is hard to create a rectangular or square pattern such as the connecting pad in a very small dimension differently from a stripe pattern. As illustrated in FIG. 2, consequently, the connecting pad CPD is considerably larger than the diameters of the contact plugs CP1 and CP0 so that a cell size (a dimension in a parallel direction with a substrate plane) is increased. In a memory separate chip, it is possible to use a special process and a layout rule for fabricating the connecting pad CPD to be small. In a logic chip or a memory embedded logic chip, however, it is necessary to correspond to various circuit layouts. For this reason, the use is impossible.

Therefore, there is employed a stacked plug system for directly connecting the upper and lower plugs without using a connecting pad. Since the connecting pad for linking the plugs is not required, an increase in a cell size can be suppressed correspondingly.

With the structure shown in FIG. 2, moreover, patterns having different film structures, that is, the connecting pad CPD and the phase change element PE1 are provided in the same layers. Therefore, a complicated process is required in the same manner as in patent document 2. However, the problem is not caused when the connecting pad CPD does not need to be fabricated.

Figure 3:
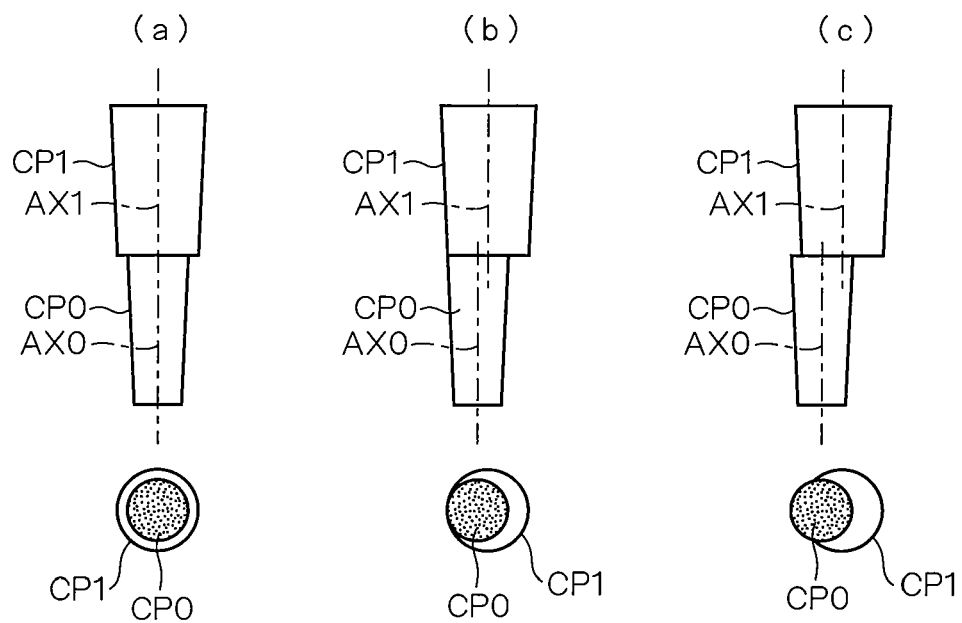
FIG. 3 is view for explaining effects of a double plug.
Figure 4:
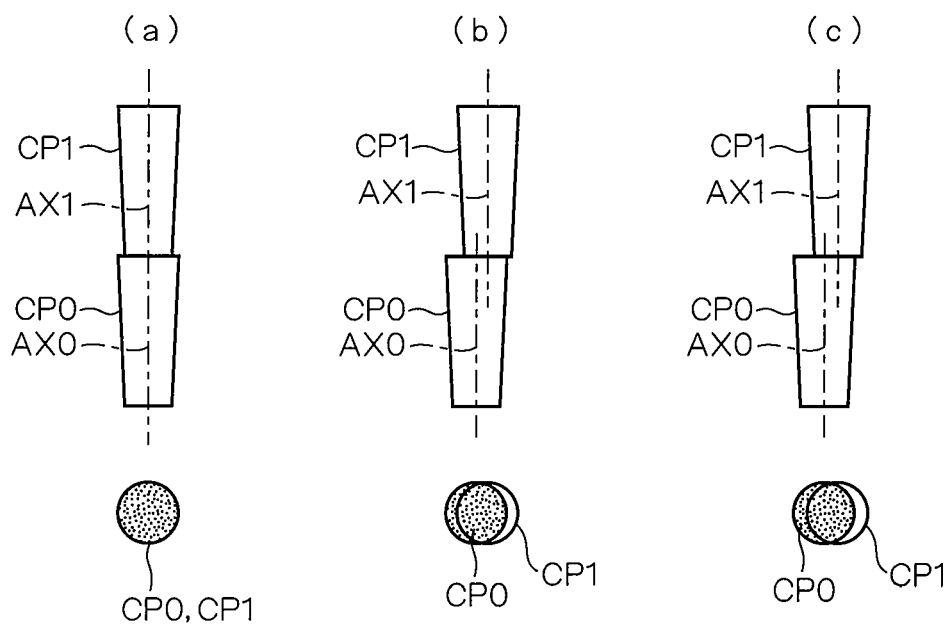
FIG. 4 is view for explaining the effects of the double plug.

With reference to FIGS. 3 and 4, next, description will be given to a scheme of the inventors in the employment of the stacked plug.

As shown in FIG. 1, in the contact plugs CP0 and CP1 for connecting the source line SL to the diffusion layer 3, the diameter of the contact plug CP1 is set to be larger than that of the contact plug CP0 on at least the ends where the contact plugs CP1 and CP2 are connected to each other. By thus carrying out the setting, it is possible to suppress a change in a contact area, and furthermore, a contact resistance also in a case in which a shaft of the plug is shifted.

FIG. 3 shows a change in a contact state which is caused by an axial shift in a case in which the diameter of the contact plug CP1 is set to be larger than that of the contact plug CP0.

(a) Portion of FIG. 3 shows a state in which a central axis AX1 of the contact plug CP1 and a central axis AX0 of the contact plug CP0 are superposed on each other without an axial shift. In a plan view showing respective end faces superposed on each other, the end face of the contact plug CP0 is included in that of the contact plug CP1. In this state, the contact areas of both of the plugs are not changed.

Moreover, (b) portion of FIG. 3 shows a state in which the central axis AX1 of the contact plug CP1 and the central axis AX0 of the contact plug CP0 are superposed on each other with a slight shift. In a plan view showing the respective end faces which are superposed on each other, the end face of the contact plug CP0 is included in that of the contact plug CP1 with difficulty. In this state, the contact areas of both of the plugs are not changed.

On the other hand, (c) portion of FIG. 3 shows a state in which the central axis AX1 of the contact plug CP1 and the central axis AX0 of the contact plug CP0 are superposed on each other with a considerable shift. In a plan view showing the respective end faces which are superposed on each other, the end face of the contact plug CP0 is slightly protruded from that of the contact plug CP1. Also in this state, the contact areas of both of the plugs are only changed slightly.

For comparison, FIG. 4 shows a change in a contact state which is caused by an axial shift in a case in which the diameter of the contact plug CP1 is set to be equal to that of the contact plug CP0 at the ends where the contact plugs CP1 and CP2 are connected to each other.

(a) Portion of FIG. 4 shows a state in which the central axis AX1 of the contact plug CP1 and the central axis AX0 of the contact plug CP0 are superposed on each other without an axial shift. In a plan view showing respective end faces superposed on each other, the end face of the contact plug CP0 is perfectly superposed on that of the contact plug CP1. In this state, the contact areas of both of the plugs are not changed.

Moreover, (b) portion of FIG. 4 shows a state in which the central axis AX1 of the contact plug CP1 and the central axis AX0 of the contact plug CP0 are superposed on each other with a slight shift. In a plan view showing the respective end faces which are superposed on each other, the end face of the contact plug CP0 is shifted from that of the contact plug CP1 by an axial shift. Thus, the central axis is slightly shifted so that the contact areas of both of the plugs are changed.

(c) Portion of FIG. 4 shows a state in which the central axis AX1 of the contact plug CP1 and the central axis AX0 of the contact plug CP0 are superposed on each other with a considerable shift. In a plan view showing the respective end faces which are superposed on each other, the end face of the contact plug CP0 is shifted from that of the contact plug CP1 by an axial shift. When the diameter of the contact plug CP1 is set to be equal to that of the contact plug CP0, thus, the contact areas of the both of the plugs are changed with a slight shift. The contact area is decreased with the axial shift of the upper and lower shifts. For this reason, there is a problem in that a variation is generated on the contact resistance due to a shift of the superposition and a circuit operation margin is decreased.

As described above, the diameter of the contact plug CP1 is set to be large on at least the ends where the contact plugs CP1 and CP2 are connected to each other. Consequently, it is possible to absorb the shift of the superposition and to suppress a change in the contact area, and furthermore, a change in the contact resistance, thereby ensuring a stable operation of the circuit.

The diameter of the contact plug CP1 positioned on the upper side is set to be large with such an intent as to be matched with a minimum dimension because the minimum dimension is generally increased to balance with a substrate flatness toward an upper layer in a semiconductor process. Moreover, a greater superposition shift can be absorbed when a diameter ratio is higher. However, a mask layout is not dense. For this reason, a ratio of the diameters of the upper and lower contact plugs is set to balance with a degree of integration of the mask layout. By setting CP1/CP0 approximately 1.1 to 1.5, however, it is possible to obtain a proper size.

In both of the contact plugs CP1 and CP0, furthermore, the diameters in the memory cell region and the peripheral circuit region are set to be equal to each other. Consequently, it is possible to minimize the number of masks which is necessary for forming the contact plug. The number of the masks is directly linked to an increase/decrease in a manufacturing cost. Therefore, the setting is effective for reducing the manufacturing cost.

<C. Variant 1>

In the semiconductor device 100 described with reference to FIG. 1, the contact plug CP1 provided in contact with the upper electrode 21 of the phase change element PE1 is disposed above the contact plug CP0 provided in contact with the thin insulating film 19. However, it is also possible to employ a structure of a semiconductor device 100A shown in FIG. 5 in consideration of an enhancement in a manufacturing yield and a reliability of a memory cell.

Figure 5:
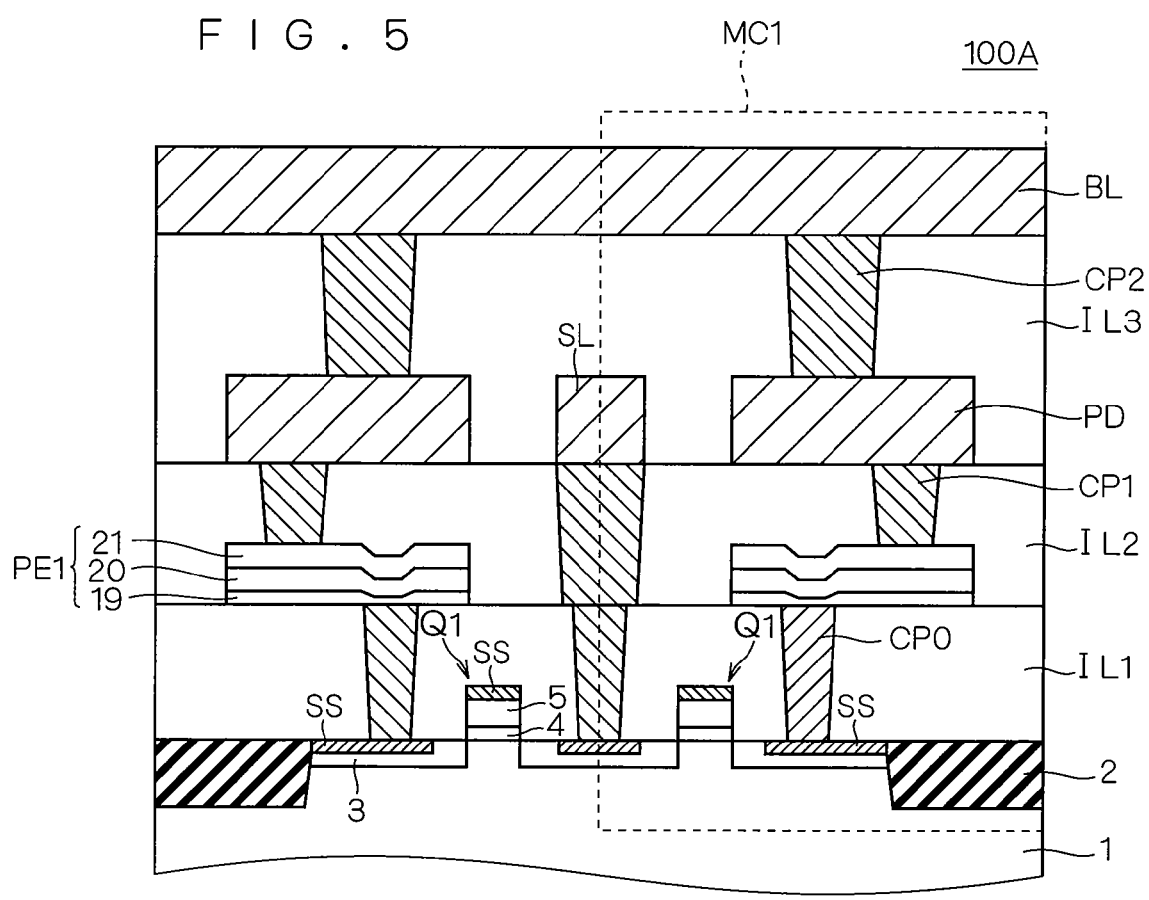
FIG. 5 is a sectional view showing a structure of a variant 1 of the semiconductor device according to the embodiment of the present invention.

More specifically, in the semiconductor device 100A shown in FIG. 5, a contact plug CP1 provided in contact with an upper electrode 21 of a phase change element PE1 is disposed in a position shifted from above a contact plug CP0 provided in contact with a thin insulating film 19. For this reason, a dimension in a planar direction of the phase change element PE1 is set to be larger than that of the semiconductor device 100. The same structures as those in the semiconductor device 100 shown in FIG. 1 have the same reference numerals and repetitive description will not be given.

In the formation of the contact plug CP0, a contact hole to reach a diffusion layer 3 through an interlayer insulating film IL1 is formed and an internal surface of the contact hole is then covered with a TiN film to form a barrier metal, for example, and a tungsten film is thereafter filled therein, for example. Then, the tungsten film and the TiN film which are present on the interlayer insulating film IL1 are polished and removed through CMP (Chemical Mechanical Polishing) to finish the end face of the contact plug CP0 flatly. However, there is a possibility that an upper surface of a plug metal might be slightly higher or lower than a surface of a surrounding insulating film due to a variation in polishing to form recesses and projections.

When the thin insulating film 19, a phase change film 20 and the upper electrode 21 are formed in that state, they reflect the recesses and projections of the end face of the contact plug CP0 onto surfaces thereof. In a case in which the phase change film 20 and the upper electrode 21 are formed by sputtering, particularly, a step of a substrate is emphasized.

When the contact plug CP1 comes in contact with the recess portion of the surface of the upper electrode 21 thus formed, there is a possibility that a contact defect or a reduction in a reliability might be caused depending on a contact position. Moreover, in some cases in which the thin insulating film 19 is formed on the recesses and projections of the end face of the contact plug CP0, a drawback is caused over the function of a resistor.

On the other hand, in the semiconductor device 100A shown in FIG. 5, the contact plug CP1 is provided in a shifted position from above the contact plug CP0. Therefore, it is possible to prevent the contact plug CP1 from coming in contact with the recess portion of the surface of the upper electrode 21, thereby enhancing the manufacturing yield and reliability of the memory cell.

<D. Variant 2>

In the semiconductor device 100 described with reference to FIG. 1, the contact plug CP1 provided in contact with the upper electrode 21 of the phase change element PE1 has a slight difference in a depth from the contact plug CP1 connected to the contact plug CP0 reaching the diffusion layer 3 serving as a source layer of an MOS transistor Q1.

In a case in which contact plugs having different depths from each other are formed, it is possible to optimize conditions for dry etching respectively by separating masks to form openings individually. Therefore, a process can be simplified. However, there is a problem in that the number of the masks is increased to increase a cost. A semiconductor device 100B shown in FIG. 6 has a structure for solving the problems.

Figure 6:
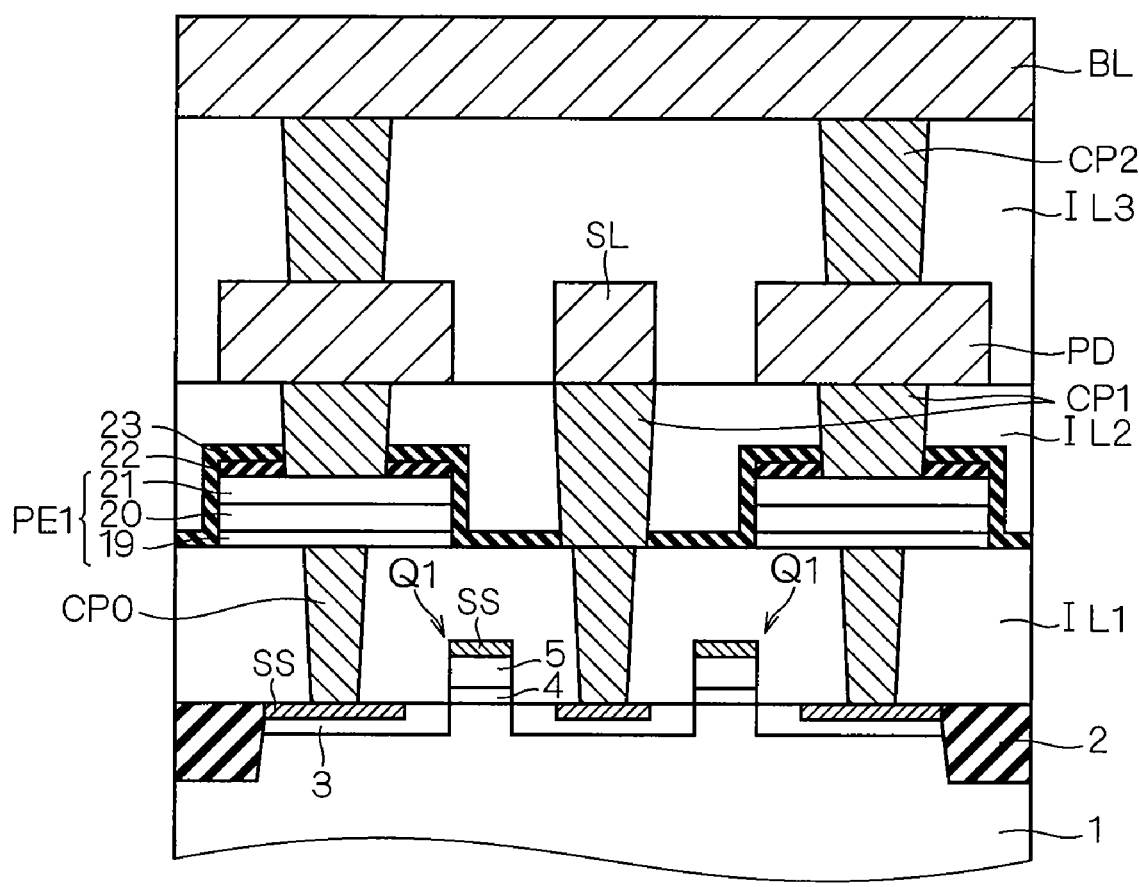
FIG. 6 is a sectional view showing a structure of a variant 2 of the semiconductor device according to the embodiment of the present invention.

More specifically, in the semiconductor device 100B shown in FIG. 6, an etching stopper film 23 constituted by an insulating film formed by a different material from an interlayer insulating film IL2 is provided to cover a phase change element PE1 and an interlayer insulating film IL1 including an end face of the contact plug CP0 which reaches the diffusion layer 3. In a case in which a silicon oxide film is used for the interlayer insulating film IL2, for example, a silicon nitride film is used for the etching stopper film 23. In addition, a hard mask 22 to be used for patterning the phase change element PE1 is left over the upper electrode 21 of the phase change element PE1. Moreover, the material of the hard mask 22 is set to be the same as that of the etching stopper film 23. The same structures as those of the semiconductor device 100 shown in FIG. 1 have the same reference numerals and repetitive description will not be given.

Also in a case in which the contact plug CP1 provided in contact with the upper electrode 21 of the phase change element PE1 has a difference in a depth from the contact plug CP1 connected to the contact plug CP0, the etching stopper film 23 is provided so that the progress of the etching is stopped at the etching stopper film 23 when a contact hole penetrating the interlayer insulating film IL2 is formed. Therefore, even if the contact hole has a difference in depth, it is possible to carry out opening etching by the same mask.

After the opening etching is stopped at the etching stopper film 23, the etching condition is switched into etching of the silicon nitride film. By this procedure, it is possible to form contact holes having different depths through the same mask.

A silicon oxide film is generally used for the material of the interlayer insulating film, and a material which can easily take an etching selection ratio thereto and can easily be treated in a silicon process is a silicon nitride film. Therefore, a combination of the silicon oxide film and the silicon nitride film is suitable for the purpose.

Next, description will be given to the reason why the hard mask 22 is provided.

Depending on the material of the phase change film 20, it is impossible to use a resist material as a mask in the etching in some cases. More specifically, a product obtained by the dry etching reacts to the resist material to be an organic material and it is hard to remove a resist after the end of the etching in some cases. In those cases, the problem is not caused by using the hard mask 22 constituted by an inorganic material.

However, the hard mask 22 cannot be removed by oxygen plasma ashing and the like. Therefore, the hard mask 22 is left on the phase change element PE1 also after the dry etching. Differently from the resist material, however, the hard mask 22 is a thermally stable material. Consequently, the problem is not caused in a subsequent manufacturing process, and the hard mask 22 can be used on assumption that it is left.

A selection of the material of the hard mask 22 is to be noted. When the material of the hard mask 22 is different from that of the etching stopper film 23, there is a possibility that the hard mask 22 covering the upper surface of the upper electrode 21 cannot be opened and a conduction to the contact plug CP1 cannot be carried out even if the etching stopper film 23 is opened. By setting the materials of the hard mask 22 and the etching stopper film 23 to be identical to each other, therefore, it is possible to etch the hard mask 22 at the step of opening etching the etching stopper film 23, thereby carrying out the conduction reliably.

As shown in FIG. 6, the hard mask 22 and the etching stopper film 23 are provided in an overlap with each other over the upper electrode 21 of the phase change element PE1, while only the etching stopper film 23 is present on the end face of the contact plug CP0 reaching the diffusion layer 3. Therefore, a total thickness of the silicon nitride film is varied. However, the hard mask 22 and the etching stopper film 23 are thinly constituted in thicknesses of 60 to 80 nm, respectively. Even if two films are provided in an overlap with each other or one film is provided, there is no problem in respect of the dry etching.

Referring to the etching stopper film 23 provided on the interlayer insulating film IL1, moreover, an etching selection ratio is increased because the interlayer insulating film IL1 is constituted by the silicon oxide film. Even if the etching is continuously carried out also after the etching stopper film 23 is removed, the interlayer insulating film IL1 is not influenced. For this reason, a difference in thickness does not matter.

<E. Manufacturing Method>

Next, a method of manufacturing the semiconductor device 100B shown in FIG. 6 will be described with reference to FIGS. 7 to 18 which are sectional views showing manufacturing steps in order.

Figure 7:
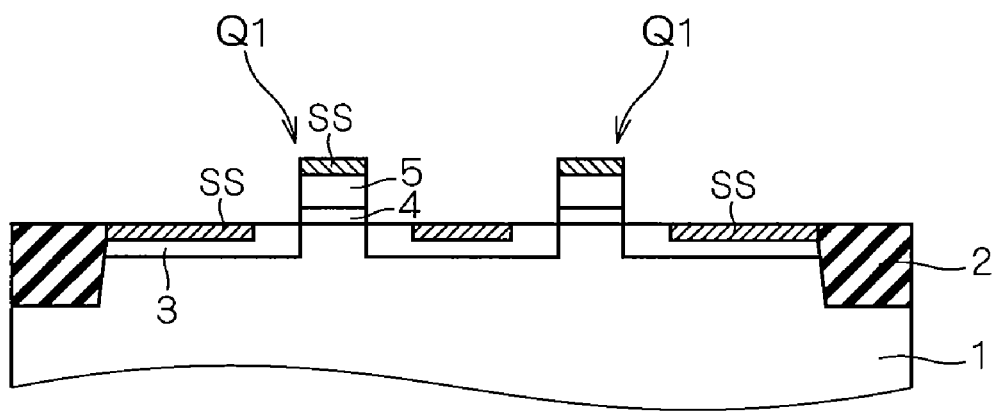
FIGS. 7 to 19 are sectional views showing a manufacturing process of the variant 2 of the semiconductor device according to the embodiment of the present invention.

First of all, at a step shown in FIG. 7, a silicon substrate 1 is prepared and an isolation insulating film 2 is selectively formed by a silicon oxide film in a surface thereof, for example, to define an active region.

Subsequently, a gate insulating film 4, a polysilicon gate electrode 5 and a sidewall insulating film (not shown) are formed on the active region by a conventional method, and the gate electrode 5 and the sidewall insulating film are used as masks to implant an impurity ion into the silicon substrate 1. Consequently, a diffusion layer 3 to function as a source or drain layer is formed to obtain an MOS transistor Q1. A profile of the diffusion layer 3 is adjusted to correspond to an MOSFET operation in a very small dimension. A structure of the MOS transistor Q1 is not restricted but can preferably supply a current which is enough for causing a phase change through a phase change element PE1.

After the MOS transistor Q1 is formed, a cobalt layer is provided over the whole surface of the silicon substrate 1, for example, and is silicided through an execution of a heat treatment. Then, an unreacted cobalt layer is removed so that a silicide layer SS ($CoSi_2$) is formed on the diffusion layer 3 and the gate electrode 5.

Figure 8:
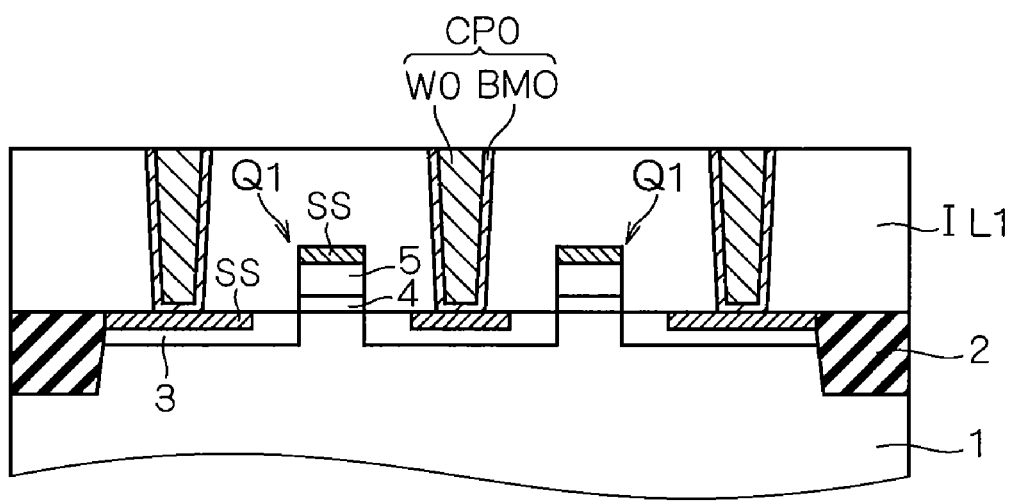

As a step shown in FIG. 8, subsequently, a silicon oxide film is deposited by a CVD (Chemical Vapor Deposition) method, for example, over the whole surface of the silicon substrate 1 to cover the MOS transistor Q1, and is flattened by CMP so that an interlayer insulating film IL1 is obtained. The interlayer insulating film IL1 has a thickness of approximately 500 nm.

Thereafter, a contact hole to reach the silicide layer SS on the diffusion layer 3 through the interlayer insulating film IL1 is formed by using a conventional photolithographic and dry etching technique (referred to as a photoetching technique). Next, a TiN film is provided into the contact hole by the CVD method to form a barrier metal BM0, and furthermore, tungsten is filled in by the CVD method to form a tungsten plug W0. Then, the tungsten film and the TiN film which are present on the interlayer insulating film IL1 are polished and removed by the CMP so that a contact plug CP0 having a diameter of approximately 160 nm is obtained.

Figure 9:
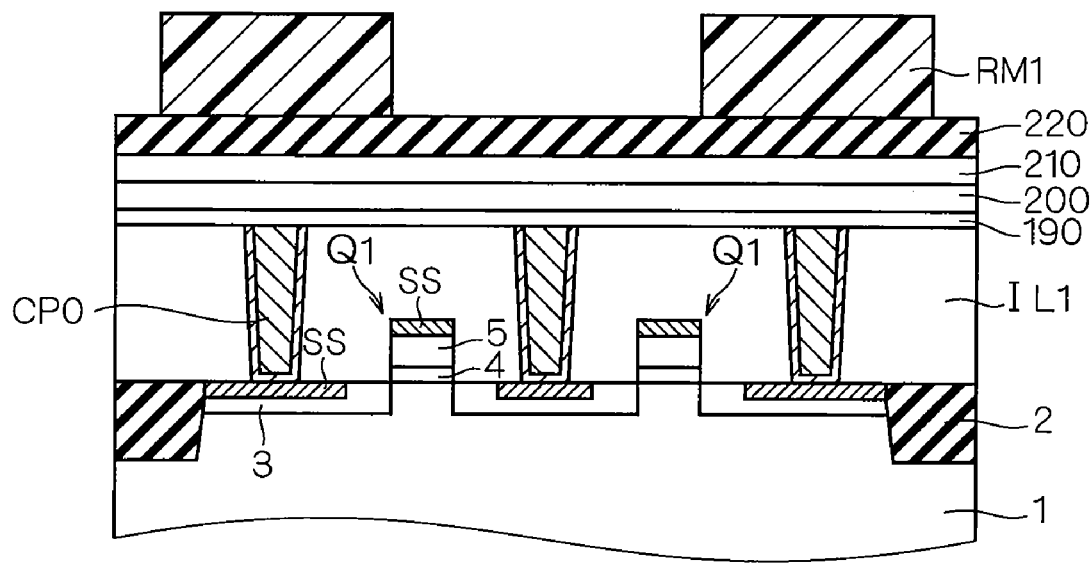

At a step shown in FIG. 9, next, a TaO (tantalum oxide) thin film 190 which has a thickness of approximately 2 nm and is changed into a thin insulating film 19 for reducing a rewriting current of the phase change element PE1 is deposited by a sputtering method. Subsequently, a GST film 200 and a W film 210 which have thicknesses of approximately 50 nm and are changed into a phase change film 20 and an upper electrode 21 respectively are deposited by the sputtering method.

The thin insulating film 19 is not restricted to TaO but is preferably formed by a material having a higher adhesion to the GST film than an interlayer insulating film material and a lower thermal conductivity than a plug material (W). For example, the same effects as those of TaO can be produced by a Ti (titanium) oxide film, a Zr (zirconium) oxide film, an Hf (hafnium) oxide film, an Nb (niobium) oxide film, a Cr (chromium) oxide film, an Mo (molybdenum) oxide film, a W (tungsten) oxide film, an Al (aluminum) oxide film and the like.

Although the description has been given to the example in which the GST (GeSbTe) is used as the phase change film, moreover, this is not restricted and it is also possible to use a chalcogenide material containing at least two elements selected from Ge, Sb and Te, an alloy with another element such as In or Ga, or GST having nitrogen or oxygen added thereto.

Thereafter, a silicon nitride film (SiNx) which has a thickness of approximately 200 nm and is changed into a hard mask material 220 is deposited on the W film 210 by the CVD method, and a resist mask RM1 is patterned thereon by the photolithographic technique. The resist mask RM1 covers a corresponding portion to a region in which the phase change element PE1 is formed (a region including an upper part of the contact plug CP0 reaching the diffusion layer 3 serving as the drain layer of the MOS transistor Q1), and the other portions are subjected to patterning to be opening portions.

Figure 10:
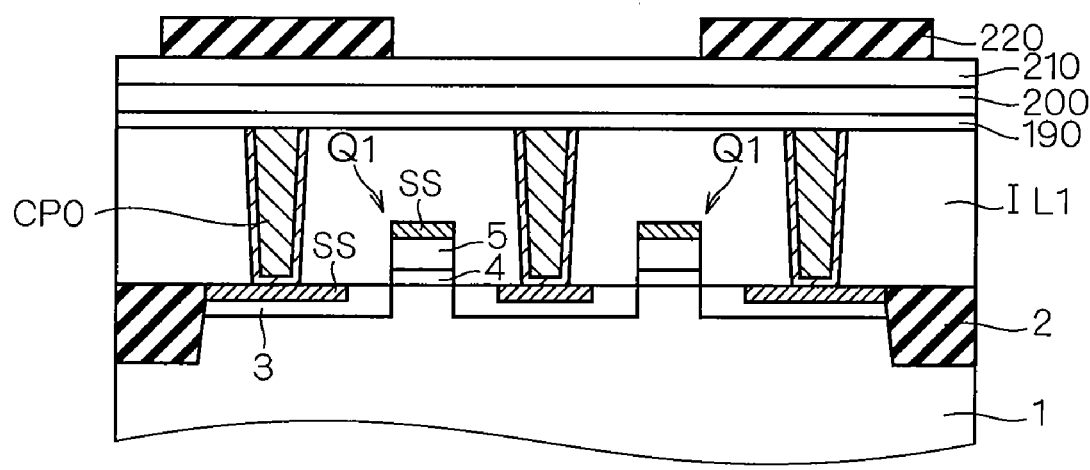

Subsequently, the resist mask RM1 is used to carry out the patterning over the silicon nitride film 220 by dry etching. As shown in FIG. 10, consequently, the silicon nitride film is left in the corresponding portion to the region in which the phase change element PE1 is formed to obtain a hard mask 22. The resist mask RM1 is removed through oxygen ashing.

Figure 11:
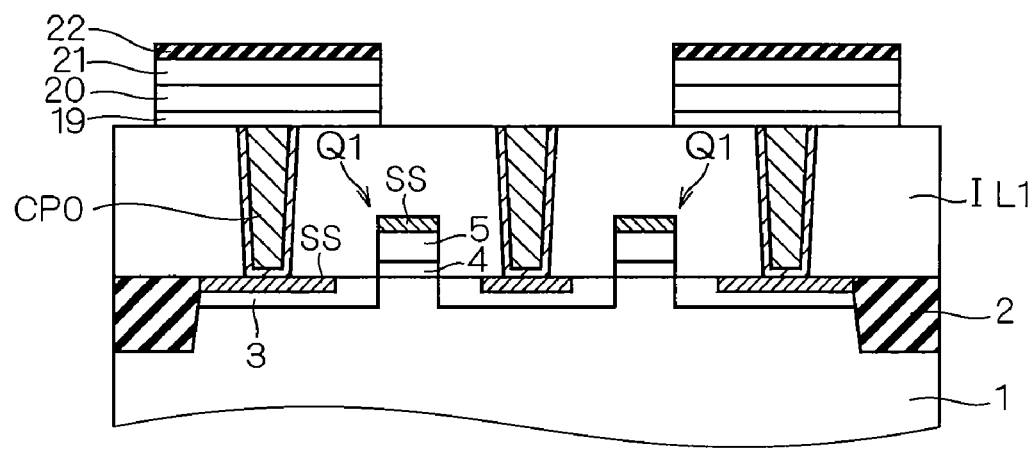

At a step shown in FIG. 11, next, the silicon nitride film 220 is used as a hard mask to sequentially carry out the dry etching over the W film 210, the GST film 200 and the TaO film 190 so that the phase change element PE1 constituted by the thin insulating film 19, the phase change film 20 and the upper electrode 21 is obtained. The hard mask 22 is also etched by the dry etching. Therefore, the hard mask 22 is left on the upper electrode 21 with the thickness decreased to be approximately 80 nm when the patterning is completed.

Figure 12:
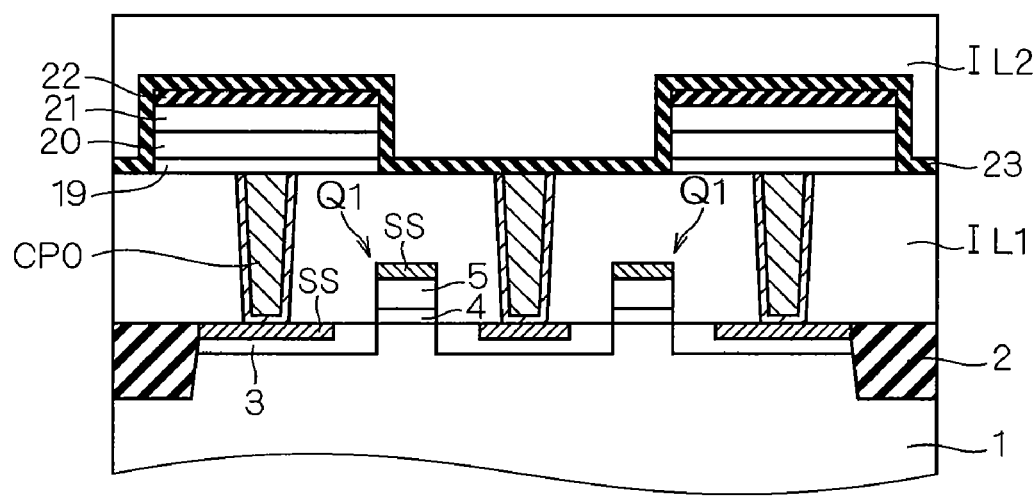

At a step shown in FIG. 12, then, a silicon nitride film (SiNx) having a thickness of approximately 60 nm is deposited by the CVD method over the whole surface of the silicon substrate 1 including the phase change element PE1 on which the hard mask 22 is left, and is set to be the etching stopper film 23. Subsequently, the silicon oxide film is deposited by the CVD method over the whole surface of the interlayer insulating film IL1 and is flattened by the CMP so that an interlayer insulating film IL2 is obtained. The interlayer insulating film IL2 has a thickness of approximately 300 nm.

Figure 13:
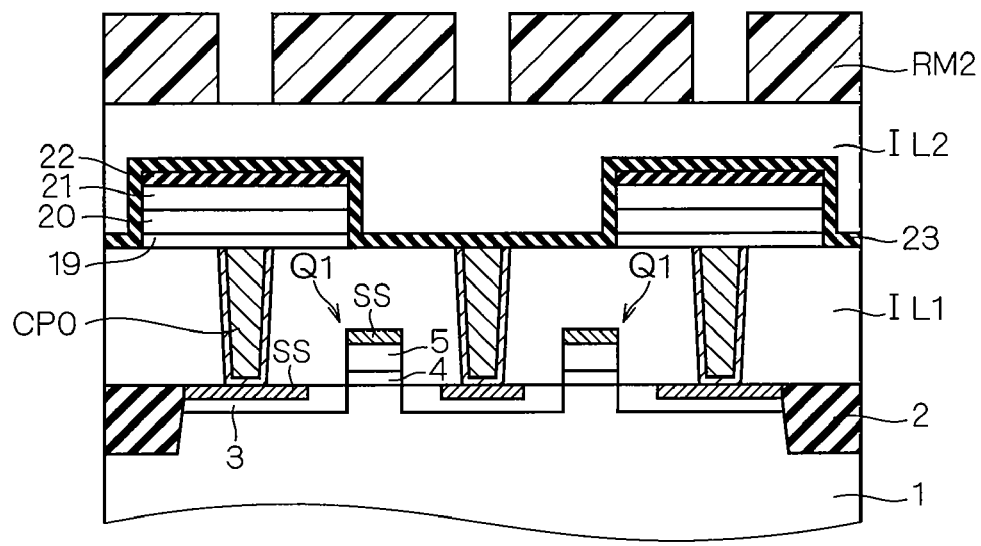

At a step shown in FIG. 13, thereafter, a resist mask RM2 is patterned on the interlayer insulating film IL2 by the photolithographic technique. The resist mask RM2 is patterned in such a manner that a corresponding portion to a region in which a contact plug CP1 is formed (an upper part of the contact plug CP0 reaching the diffusion region 3 serving as the source layer of the MOS transistor Q1 and an upper part of the hard mask 22 provided on the phase change element PE1) is an opening portion.

Figure 14:
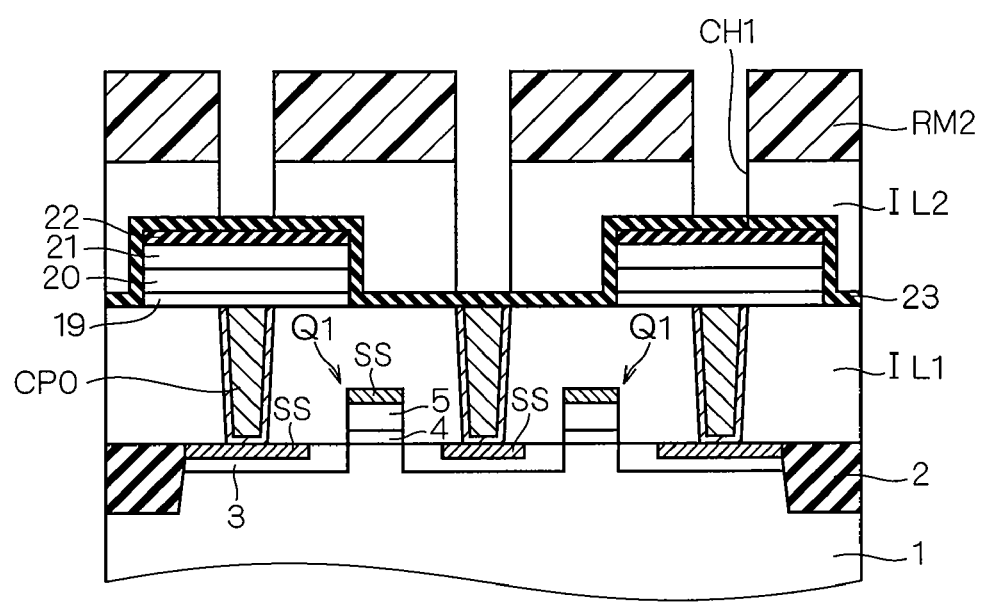

At a step shown in FIG. 14, next, the resist mask RM2 is used to form a plurality of contact holes CH1 penetrating the interlayer insulating film IL2 by the dry etching. In the dry etching, the etching condition is adjusted in such a manner that an etching speed is high in the silicon oxide film and is low in the silicon nitride film. In all of the contact holes CH1, the etching is stopped at the etching stopper film 23.

Figure 15:
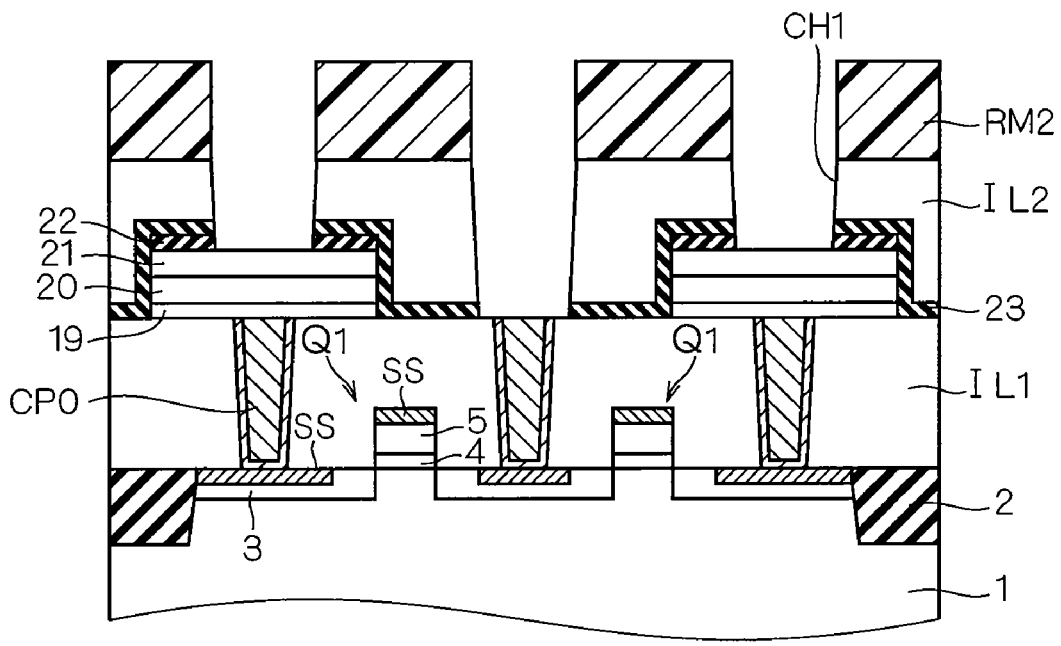

At a step shown in FIG. 15, subsequently, the etching condition is changed in such a manner that the etching speed is increased in the silicon nitride film, and the dry etching is carried out again. Consequently, the etching stopper film 23 in the bottom part of the contact hole CH1 is removed. In the contact hole CH1 formed on the contact plug CP0, the end face of the contact plug CP0 is exposed and the hard mask 22 is also removed in the contact hole CH1 formed on the phase change element PE1 so that the surface of the upper electrode 21 is exposed.

Figure 16:
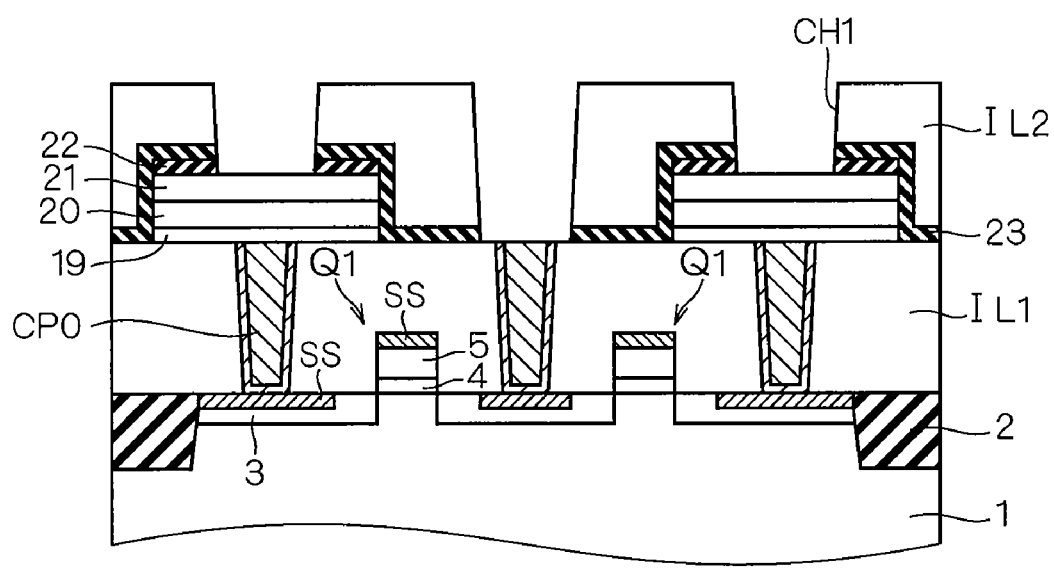

At a step shown in FIG. 16, then, the resist mask RM2 is removed by oxygen ashing.

Figure 17:
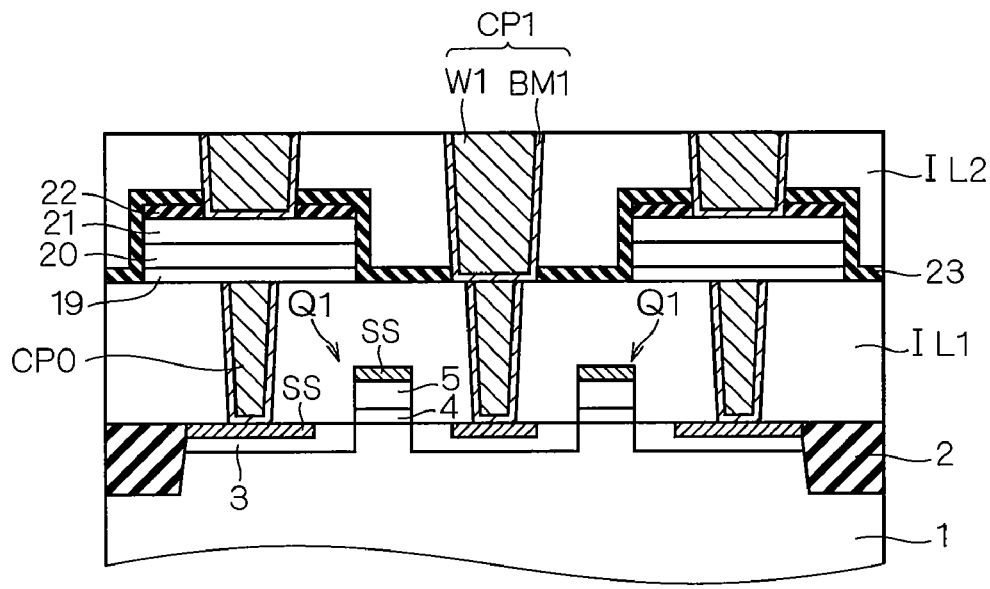

At a step shown in FIG. 17, thereafter, a TiN film is provided in the contact hole CH1 by the sputtering method to form a barrier metal BM1, and furthermore, tungsten is filled in by the CVD method to form a tungsten plug W1. The TiN film is formed by the sputtering method because the GST film might be damaged thermally. Moreover, the TiN film may be formed by a low temperature CVD method which does not exceed 600° C. Subsequently, the tungsten film and the TiN film which are present on the interlayer insulating film IL2 are polished and removed by the CMP so that the contact plug CP1 having a diameter of approximately 200 nm is obtained. In this case, a ratio of the diameters of the contact plugs CP0 and CP1 is 200 nm/160 nm=1.25.

Figure 18:
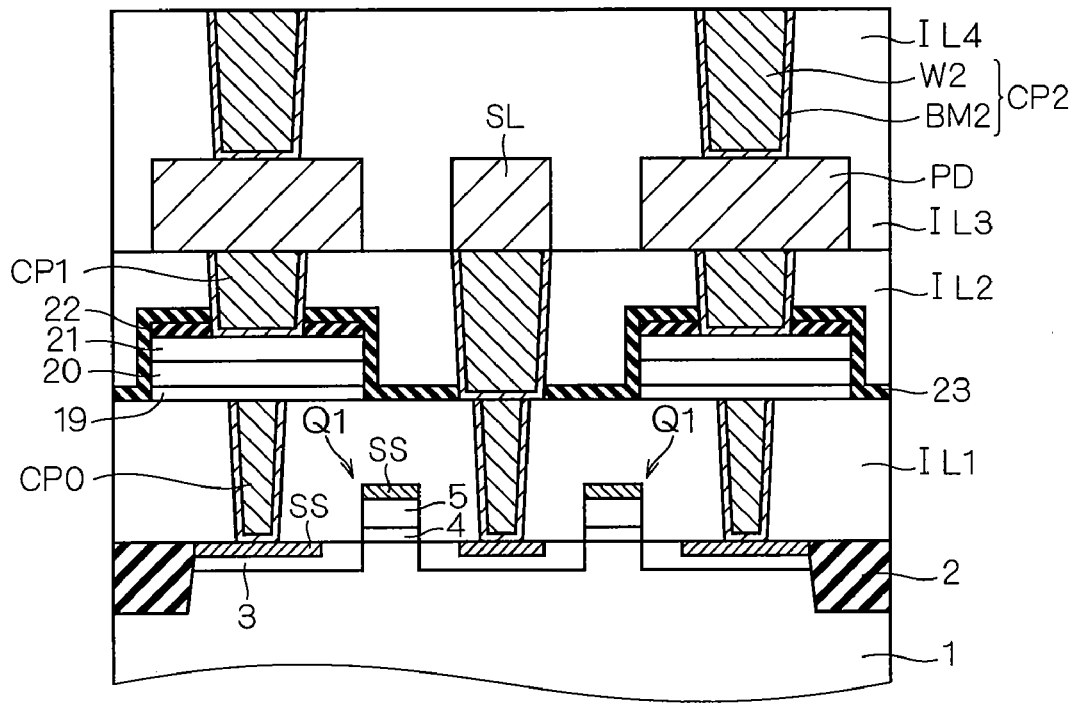

Subsequently, it is sufficient that a multilayer wiring layer is formed by using an ordinary multilayer wiring forming process. For example, as shown in FIG. 18, an aluminum layer is formed on the interlayer insulating film IL2 by the sputtering method and is then subjected to patterning so that a source line SL and a connecting pad PD are formed. Thereafter, a silicon oxide film is deposited over the whole surface of the interlayer insulating film IL2 by the CVD method and is flattened by the CMP so that an interlayer insulating film IL3 is obtained.

A contact hole reaching the connecting pad PD penetrating the interlayer insulating film IL3 is formed by the photoetching technique and a TiN film is provided in the contact hole by the sputtering method to form a barrier metal BM2, and furthermore, tungsten is filled in by the CVD method to form a tungsten plug W2. The TiN film is formed by the sputtering method because the GST film might be damaged thermally. Moreover, the TiN film may be formed by the low temperature CVD method which does not exceed 600° C. Thereafter, the tungsten film and the TiN film which are present on the interlayer insulating film IL3 are polished and removed by the CMP so that a contact plug CP2 having a diameter of approximately 200 nm and a depth of approximately 300 nm is obtained. Furthermore, an aluminum layer is formed on the interlayer insulating film IL3 by the sputtering method, for example, and a bit line BL is then formed by the patterning so that the semiconductor device 100B shown in FIG. 6 is obtained.

The phase change memory can also be applied to an Al wiring and a Cu wiring. In a case in which the multilayer wiring layer and the phase change element are formed sepa-rately as in the present invention, particularly, an existing structure can be exactly applied even if the multilayer wiring layer is formed of Cu or Al, and a high compatibility can be obtained.

Figure 19:
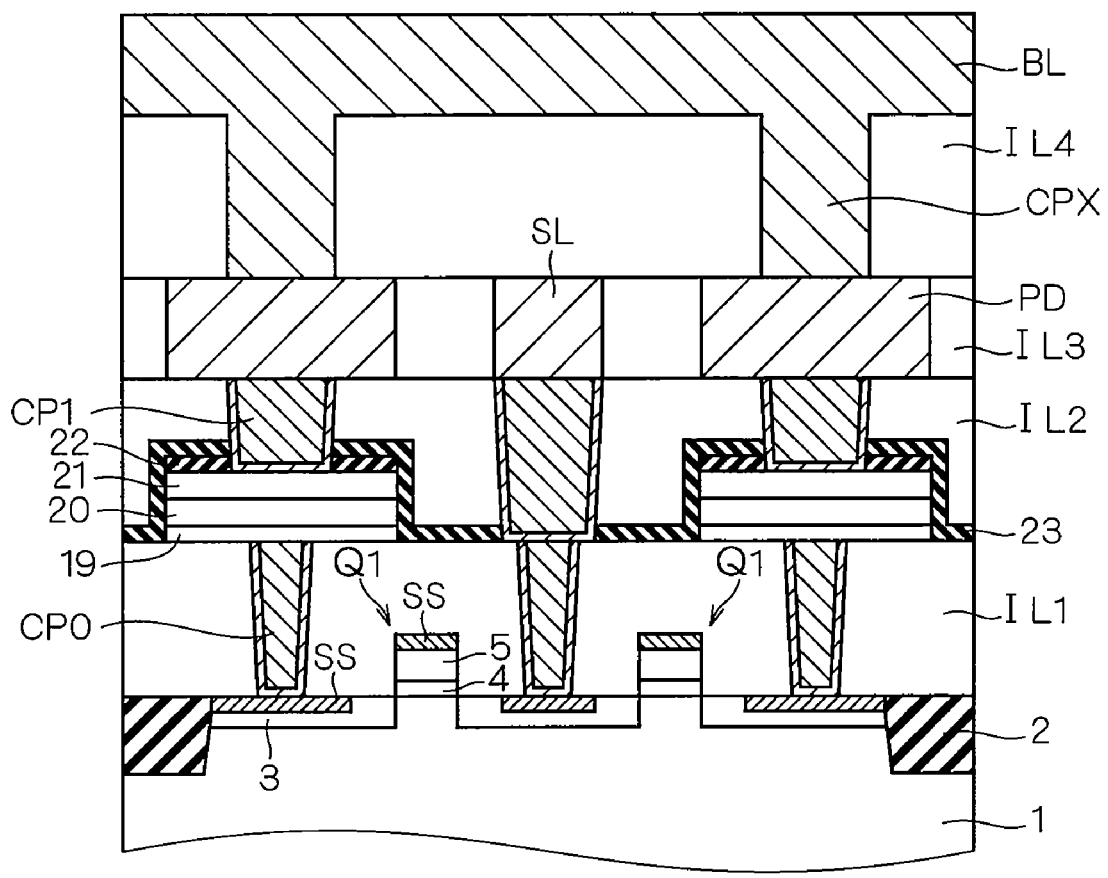
Figure 20:
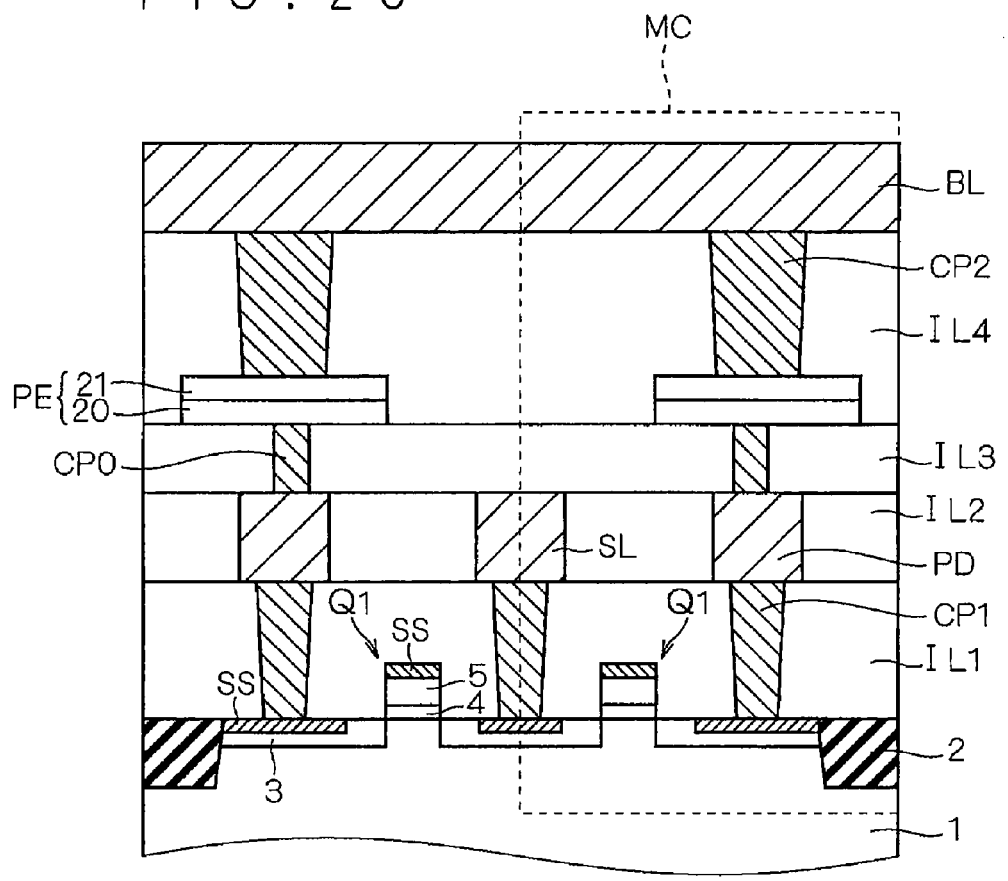
FIG. 20 is a sectional view showing a structure of a conventional semiconductor device.

FIG. 19 shows an example in which a Cu wiring technique in a 130 nm generation is applied.

As shown in FIG. 19, an interlayer insulating film IL3 is deposited on an interlayer insulating film IL2 and a wiring trench for forming a wiring layer is provided, and the wiring trench is then filled with a copper layer through plating by single damacine. Consequently, a source line SL and a connecting pad PD are formed by a copper wiring. Thereafter, a silicon oxide film is deposited over the whole surface of the interlayer insulating film IL3 by the CVD method and is flattened by the CMP so that an interlayer insulating film IL4 is obtained.

Next, a contact hole reaching the connecting pad PD through the interlayer insulating film IL4 is formed and a wiring trench for forming a wiring layer is further provided, and the contact hole and the wring trench are then filled with a copper layer through the plating by dual damacine. Consequently, a contact plug CPX and a bit line BL are formed at the same time. Subsequently, the formation of the interlayer insulating film and the dual damacine are repeated so that a further upper wiring layer is formed.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a field effect transistor provided on a semiconductor substrate;
a first interlayer insulating film for covering said field effect transistor;
a second interlayer insulating film for covering said first interlayer insulating film;
a phase change element having a phase change film capable of carrying out a phase change into a crystalline state and an amorphous state by a main current of said field effect transistor; and
a multilayer wiring layer provided on said semiconductor substrate,
wherein a lowermost layer wiring of said multilayer wiring layer is provided on said second interlayer insulating film,
said first interlayer insulating film has a plurality of first layer contact plugs which penetrates said first interlayer insulating film and is provided in contact with first and second diffusion layers of said field effect transistor,
said second interlayer insulating film has a plurality of second layer contact plugs which penetrates said second interlayer insulating film and is provided in contact with said lowermost layer wiring, and
said phase change element is provided on said first interlayer insulating film and has a lower surface provided in contact with an end face of a first plug in said plurality of first layer contact plugs which reaches said first diffusion layer, and
a second plug in said plurality of first layer contact plugs which reaches said second diffusion layer and a third plug to be one of said plurality of second layer contact plugs are directly connected to each other, thereby constituting a stacked plug.

2. The semiconductor device according to claim 1, wherein said phase change element has a thin insulating film provided between said phase change film and said first interlayer insulating film, and said thin insulating film has a thickness which can cause the main current of said field effect transistor to flow as a transmitting current.

3. The semiconductor device according to claim 2, wherein said thickness of said thin insulating film is 0.5 nm to 5 nm.

4. The semiconductor device according to claim 3, wherein said thin insulating film is selected from a Ta oxide film, a Ti oxide film, a Zr oxide film, an Hf oxide film, an Nb oxide film, a Cr oxide film, an Mo oxide film, a W oxide film and an Al oxide film.

5. The semiconductor device according to claim 1, wherein a diameter of said third plug is larger than the diameter of said second plug.

6. The semiconductor device according to claim 5, wherein a ratio of the diameter of said third plug to the diameter of said second plug is 1.1 to 1.5.

7. The semiconductor device according to claim 1, further comprising:

a hard mask provided on an upper surface of said phase change element and used for patterning said phase change element; and an etching stopper film for covering said first interlayer insulating film together with said phase change element including said hard mask.

8. The semiconductor device according to claim 7, wherein materials of said etching stopper film and said second interlayer insulating film are different from each other, and materials of said hard mask and said etching stopper film are identical to each other.

9. The semiconductor device according to claim 8, wherein said material of said etching stopper film is a silicon nitride film and that of said second interlayer insulating film is a silicon oxide film.

* * * * *